(12) United States Patent
Chan et al.

(10) Patent No.: US 10,784,158 B2
(45) Date of Patent: Sep. 22, 2020

(54) AREA-SELECTIVE DEPOSITION OF A TANTALUM SILICIDE TASI$_x$ MASK MATERIAL

(71) Applicant: IMEC VZW, Leuven (BE)

(72) Inventors: Boon Teik Chan, Leuven (BE); Efrain Altamirano Sanchez, Kessel-Lo (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/412,923

(22) Filed: May 15, 2019

(65) Prior Publication Data

US 2019/0355619 A1 Nov. 21, 2019

(30) Foreign Application Priority Data

May 17, 2018 (EP) .................................... 18173024

(51) Int. Cl.
*H01L 21/768* (2006.01)
*H01L 21/311* (2006.01)

(52) U.S. Cl.
CPC ...... *H01L 21/76879* (2013.01); *H01L 21/311* (2013.01); *H01L 21/76897* (2013.01)

(58) Field of Classification Search
CPC ............. H01L 21/311; H01L 21/76879; H01L 21/76897
See application file for complete search history.

(56) References Cited

U.S. PATENT DOCUMENTS

| | | | |
|---|---|---|---|
| 5,847,465 A | * | 12/1998 | Liou ..................... H01L 21/033 257/774 |
| 6,025,255 A | | 2/2000 | Chen et al. |
| 6,573,602 B2 | | 6/2003 | Seo et al. |
| 9,773,700 B1 | | 9/2017 | Burns et al. |

(Continued)

OTHER PUBLICATIONS

European Search Report, European Patent Application No. 18173024. 3, dated Nov. 28, 2018, 5 pages.

(Continued)

*Primary Examiner* — Andrew Q Tran
(74) *Attorney, Agent, or Firm* — McDonnell Boehnen Hulbert & Berghoff LLP

(57) ABSTRACT

A method for forming a cavity in a semiconductor structure and an intermediate structure is provided. The method includes: (a) providing a semiconductor structure comprising: (i) a semiconductor substrate; (ii) a set of line structures on the semiconductor substrate, each line structure having a top surface and sidewalls, the line structures being separated by trenches therebetween, and (iii) an oxygen-containing dielectric material at least partially filling the trenches in-between the line structures, wherein the top surface of at least one of the line structures is at least partially exposed, and wherein the exposed part of the top surface is composed of an oxygen-free dielectric material; (b) forming a layer of TaSi$_x$ selectively onto the oxygen-free dielectric material with respect to the oxygen-containing dielectric material (c) forming the cavity by selectively removing at least a portion of the oxygen-containing dielectric material with respect to the TaSi$_x$.

20 Claims, 4 Drawing Sheets

(56) References Cited

U.S. PATENT DOCUMENTS

| | | | |
|---|---|---|---|
| 2003/0003714 A1 | 1/2003 | Lee et al. | |
| 2004/0038546 A1 | 2/2004 | Ko | |
| 2006/0240654 A1 | 10/2006 | Wei et al. | |
| 2008/0188081 A1 | 8/2008 | Chi et al. | |
| 2012/0267727 A1 | 10/2012 | Ho et al. | |
| 2015/0170965 A1 | 6/2015 | Indrakanti et al. | |
| 2015/0235861 A1 | 8/2015 | Mizuno et al. | |
| 2016/0203995 A1 | 7/2016 | Kanarik et al. | |
| 2016/0365343 A1 | 12/2016 | Lin et al. | |
| 2020/0098886 A1* | 3/2020 | Liu | H01L 27/0886 |

OTHER PUBLICATIONS

"LAM Research—New Atomic Layer Etching Capability Enables Continued Device Scaling", http://www.blog.baldengineering.com/2016/09/lam-research-new-atomic-layer-etching.html, Nov. 9, 2017, pp. 1-7.

* cited by examiner

AREA-SELECTIVE DEPOSITION OF A TANTALUM SILICIDE TASI$_x$ MASK MATERIAL

CROSS-REFERENCE TO RELATED APPLICATIONS

The present application claims priority from European Patent Application No. 18173024.3, filed on May 17, 2018, which is hereby incorporated by reference in its entirety.

TECHNICAL FIELD OF THE DISCLOSURE

The present disclosure relates to the formation of a cavity in a semiconductor structure, in particular to the formation of such a cavity based on the area-selective deposition of a mask material.

BACKGROUND OF THE DISCLOSURE

In the fabrication of semiconductor devices (e.g. field effect transistors (FETs)), there is often a need to form cavities which are relatively narrow but nevertheless have a relatively high depth/width aspect ratio. As the downscaling of these semiconductor devices continues to advance, forming such cavities becomes increasingly demanding. Indeed, not only does the downscaling typically require the cavities to become narrower, also the elements surrounding the cavity typically must decrease in size.

For example, in the fully self-aligned contact patterning of e.g. source/drain contacts in the fabrication of FETs, it may desirable to further scale down the gate pitch by using thinner spacers. However, achieving a sufficient aspect ratio for the space between the gate structures without over etching into the gate plug or the sidewall spacers then becomes a non-trivial challenge to overcome.

U.S. Pat. No. 6,573,602 B2 discloses a method for forming a self-aligned contact. In order to form the cavity for the self-aligned contact, the method uses six distinct insulating layers, two of which are nitride layers functioning as etch stoppers. The two nitride insulating layers may be considered as jointly forming a double spacer. However, this plurality of insulating layers results in a relatively thick spacer region, thereby preventing a tight gate spacing.

There is thus still a need in the art for ways to address some or all of the above-mentioned challenges.

SUMMARY OF THE DISCLOSURE

It is an object of the present disclosure to provide good methods and associated intermediates for forming a cavity in a semiconductor structure. This objective is accomplished by a method and an intermediate structure according to the present disclosure.

In some embodiments of the present disclosure, a high etch selectivity can be achieved when making the cavity.

In some embodiments of the present disclosure, a cavity with a high aspect ratio can be made (e.g. a cavity that is relatively deep compared to its width).

In some embodiments of the present disclosure, a cavity can be made while minimizing the damage to surrounding elements in the structure (e.g. to the sidewalls which define the cavity).

In some embodiments of the present disclosure, the formation of the cavity can be integrated into fabrication processes for different types of semiconductor structures, including semiconductor devices such as transistors.

In some embodiments of the present disclosure, formation of the cavity can be done in highly scaled down semiconductor structures, such as those corresponding to the 7 nm technology node, the 5 nm technology node, or even lower. In some embodiments of the present disclosure, cavity formation may be compatible with a tight pitch between different elements (e.g. gate structures) in the semiconductor structures.

In some embodiments of the present disclosure, cavity can be formed in a relatively simple and economical manner.

In some embodiments of the present disclosure, an intermediate step in the method can concurrently enable a non-metallic hardmask to be formed. In some embodiments of the present disclosure, the use of a non-metallic hardmask can avoid the introduction of metallic contamination in semiconductor structures.

In a first aspect, the present disclosure relates to a method for forming a cavity in a semiconductor structure, the method comprising:
a. providing a semiconductor structure comprising:
  i. a semiconductor substrate;
  ii. a set of line structures on the semiconductor substrate, each line structure having a top surface and sidewalls, the line structures being separated by trenches therebetween; and
  iii. an oxygen-containing dielectric material at least partially filling the trenches in-between the line structures, wherein the top surface of at least one of the line structures is at least partially exposed, and wherein the exposed part of the top surface is composed of an oxygen-free dielectric material;
b. forming a layer of TaSi$_x$ selectively onto the oxygen-free dielectric material with respect to the oxygen-containing dielectric material; and
c. forming the cavity by selectively removing at least a portion of the oxygen-containing dielectric material with respect to the TaSi$_x$.

In a second aspect, the present disclosure relates to an intermediate structure for forming a cavity in a semiconductor structure, comprising:
  i. a semiconductor substrate;
  ii. a set of line structures on the semiconductor substrate, each line structure comprising a top surface, the line structures being separated by trenches therebetween, wherein the top surface of at least one of the line structures is composed of an oxygen-free dielectric material;
  iii. an oxygen-containing dielectric material filling at least partially the trenches in-between the line structures; and
  iv. a layer of TaSi$_x$ covering the oxygen-free dielectric material selectively with respect to the oxygen-containing dielectric material.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and benefits of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE DRAWINGS

FIG. 1 is a schematic representation of a semiconductor structure comprising a semiconductor substrate (100), the semiconductor substrate (100) comprises a semiconductor active area (200) in the form of Si semiconductor fin.

FIG. 2 is a schematic representation showing a 10 nm $SiO_2$ dielectric overlayer (500) deposited over the semiconductor structure and a patterned $Si_xN_y$ oxygen-free dielectric hardmask (600) is provided thereon.

FIG. 3 is a schematic representation of a pattern that is partially etched down by removing the oxygen-containing dielectric material, i.e. a portion of the overlayer (500) and/or filled trench (410) selectively with respect to the oxygen-free dielectric material, i.e. the gate plug (320), spacers (330) and/or hardmask (600), to such an extent as to expose the top surface of the gate plug (320) and spacers (330).

FIG. 4 is a schematic representation showing a layer of $TaSi_x$ (700) that is deposited selectively onto the oxygen-free dielectric material (320,330,600) with respect to the oxygen-containing dielectric material (410), thereby forming a mask (700) covering at least the top surface of the gate plug (320), spacers (330) and/or hardmask (600).

FIG. 5 is a schematic representation showing the oxygen-containing dielectric material (410) being further removed from within the trenches (400), selectively with respect to the $TaSi_x$ (700) and oxygen-free dielectric material (320, 330,600).

FIG. 6 is a schematic representation showing the trenches (400) are lined with a Ti and/or TiN barrier layer (not shown) using ALD and overfilled with a W contact metal (810) using CVD or ALD.

FIG. 7 is a schematic representation showing the removal of contact metal (810) overburden by a chemical-mechanical planarization (CMP), thereby simultaneously also removing the $TaSi_x$ material (700).

Figure 1:
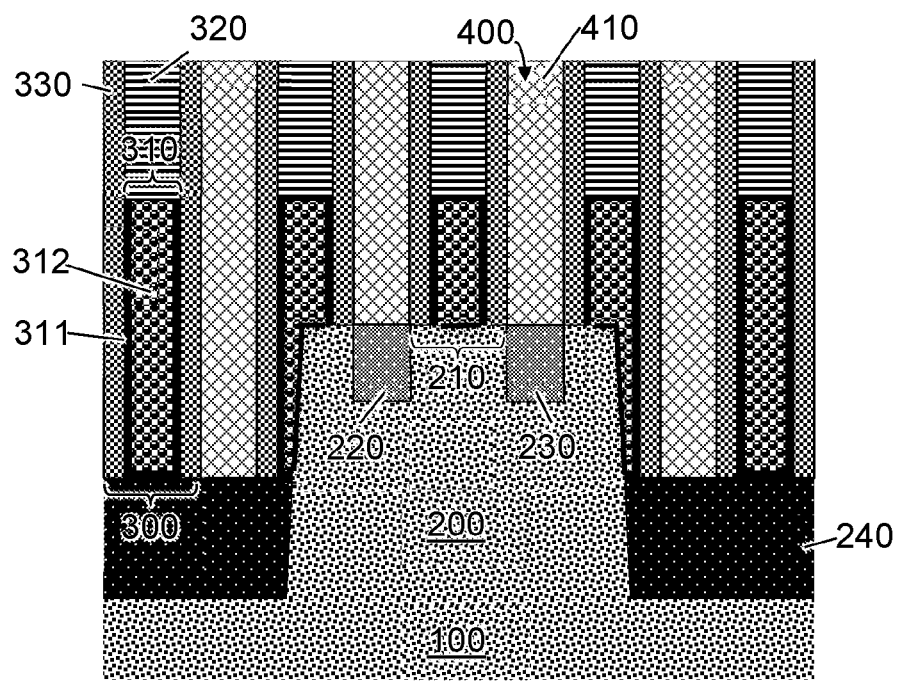
FIGS. 1 to 7 are schematic representations of vertical cross-sections through a semiconductor structure at different steps in a method for forming and subsequently filling a cavity, in accordance with embodiments of the present disclosure.

In the different figures, the same reference signs refer to the same or analogous elements.

DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, over and the like in the description and the claims are used for descriptive purposes and not necessarily for describing relative positions. It is to be understood that the terms so used are interchangeable with their antonyms under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Reference will be made to transistors. These are devices having a first main electrode such as a drain, a second main electrode such as a source and a control electrode such as a gate for controlling the flow of electrical charges between the first and second main electrodes.

It will be clear for a person skilled in the art that the present disclosure is also applicable to similar devices that can be configured in any transistor technology, including for example, but not limited thereto, CMOS, BICMOS, Bipolar and SiGe BICMOS technology.

The following terms are provided solely to aid in the understanding of the disclosure.

As used herein, and unless otherwise specified, when a first material is said to be removed or etched selectively with respect to a second material, this means that the first material is removed or etched faster than the second material. In some embodiments, the removal or etching process would remove or etch the first material at least twice faster, at least five times faster, or at least ten times faster, than the second material. In some embodiments, the second material may be substantially not removed or etched by the removal or etching process.

As used herein, and unless otherwise specified, subscripts 'x' and 'y' in chemical formulae denote a corresponding integer or non-integer subscript number, and said subscript numbers are independently selected from one chemical formula to the next. For example, when considering the formulae '$TaSi_x$'. and '$Si_xN_y$', it is understood that both 'x'-values are not necessarily equal; though they could be equal in some embodiments.

As used herein, and unless otherwise specified, under 'source/drain' is understood a 'source and/or drain'. Likewise, under 'source/drain entity', e.g. source/drain region, is understood a 'source entity and/or drain entity', e.g. a source region and/or drain region. In embodiments, a source and a drain may be comparable (e.g. indistinguishable) and their designation may depend on a relative voltage difference that is put across them in the final semiconductor device.

As used herein, and unless otherwise specified, the term oxygen-free dielectric material refers to a dielectric material which chemical formula does not comprise oxygen, i.e. it is not an oxide (e.g. it might be a nitride). The term "oxygen-free is used to express that there is substantially no oxygen in the material.

As used herein, and unless otherwise specified, the term oxygen-containing dielectric material refers to a material which chemical formula comprise oxygen, e.g. it is an oxide.

In a first aspect, the present disclosure relates to a method for forming a cavity in a semiconductor structure, the method comprising:
a. providing a semiconductor structure comprising:
  i. a semiconductor substrate;
  ii. a set of line structures on the semiconductor substrate, each line structure having a top surface and sidewalls, the line structures being separated by trenches therebetween; and
  iii. an oxygen-containing dielectric material at least partially filling the trenches in-between the line structures, wherein the top surface of at least one of the line structures is at least partially exposed, and wherein the exposed part of the top surface is composed of an oxygen-free dielectric material;
b. forming a layer of $TaSi_x$ selectively onto the oxygen-free dielectric material with respect to the oxygen-containing dielectric material; and
c. forming the cavity by selectively removing at least a portion of the oxygen-containing dielectric material with respect to the $TaSi_x$.

The semiconductor structure may typically also be referred to as a semiconductor device. The semiconductor structure may, for example, be a structure for forming a semiconductor circuit comprising one or more transistors, such as for forming a complementary metal oxide semiconductor (CMOS) structure. The transistors may, for example, be fin field effect transistors (FinFETs).

In embodiments, the substrate may comprise at least one semiconductor active area. In embodiments, the semiconductor active area may comprise a channel region and/or a source region and/or a drain region. In embodiments, the semiconductor active area may comprise one or more materials selected from Si, SiGe and Ge; for example, the channel region and/or the source region and/or the drain region may comprise a material selected from Si, SiGe and Ge. In embodiments, the source region and the drain region may define the channel region therebetween. In embodiments, the semiconductor active area may comprise a fin structure. In embodiments, the fin structure may comprise the channel region, the source region, and the drain region. In embodiments, the fin structure may comprise one or more materials selected from Si, SiGe, and Ge. In embodiments, a dielectric material may be present between two fin structures. In embodiments, the dielectric material may be $SiO_2$. The dielectric material can provide an electrical isolation between two fin structures. In embodiments, the source/drain regions may be epitaxially grown (e.g. in cavities formed in the fin structure) and may optionally be doped. In embodiments, the source/drain regions may comprise SiGe:P or SiGe:B.

In embodiments, at least one of the line structures may comprise:
a gate structure over the channel region, the gate structure having a top surface and sidewalls,
a gate spacer lining at least one of the sidewalls of the gate structure, and
a gate cap (e.g. gate plug) covering the top surface of the gate structure.

In embodiments, the gate structure may comprise a gate dielectric (typically in contact with the semiconductor active area), a work function adjustment metal (i.e. a work function tuning metal) and a gate contact. In embodiments, the gate structure may define the channel region in the semiconductor active area it overlaps. In embodiments, the gate structure may be formed by a replacement metal gate (RMG) process. In embodiments, the gate dielectric may be a high-k material (e.g. $HfO_2$). In embodiments, the work function adjustment metal may be selected from TiN, TaN, TiSiN, TiAl and TiC. In embodiments, the gate contact may comprise (e.g. consist of) W.

In embodiments, the gate spacer may comprise the oxygen-free dielectric material. The gate spacer may offer a level of protection (e.g. in a sideways direction) to the gate structure from being damaged (e.g. etched) during steps of the present method and/or further steps for fabricating the final device (e.g. the semiconductor circuit). Additionally, in the final device, the spacer can provide an electrical isolation between the gate contact on the one hand and a source/drain contact on the other hand. In embodiments, the gate spacer may be provided using a chemical vapour deposition (CVD) or an atomic layer deposition (ALD). In embodiments, the gate spacer may initially (e.g. before step b) have a thickness of from 5 to 15 nm, usually from 7 to 10 nm. In embodiments, the gate spacer may ultimately (e.g. after step c or d) have a thickness of from 1 to 10 nm, usually from 3 to 8 nm. For example, the final (i.e. ultimate) gate spacer thickness for a device at the 7 nm technology node may be about 7 nm, while it may be about 5 nm for further technology nodes (e.g. N5).

In embodiments, the gate cap may comprise the oxygen-free dielectric material. The gate cap may offer a level of protection (e.g. in a top-down direction) to the gate structure against damages (e.g. during etching) during steps of the present method and further steps for fabricating the final device (e.g. the semiconductor circuit). Additionally, in the final device, the gate cap can provide an electrical isolation between the gate contact on the one hand and an overlying metallization layer on the other hand. In embodiments, the gate cap may be provided using a chemical vapour deposition (CVD) or an atomic layer deposition (ALD), usually CVD. In embodiments, the gate cap may have a height of from 10 to 100 nm, usually from 30 to 70 nm.

In embodiments, the gate spacer and/or the gate plug may be provided using a chemical vapour deposition (CVD) or an atomic layer deposition (ALD). In some embodiments, both the gate spacer and the gate cap may comprise the oxygen-free dielectric material.

In embodiments, the oxygen-free dielectric material may be a nitride material, such as silicon nitride ($Si_xN_y$). In embodiments, the silicon nitride may be $Si_3N_4$.

In embodiments, the oxygen-containing dielectric material may be $SiO_2$. In embodiments, the oxygen-containing dielectric material may be an interlayer dielectric (ILD).

Trenches in-between the line structures are at least partially filled with the oxygen-containing dielectric material. In embodiments, at least one trench may have a width (e.g. a shortest dimension parallel to the substrate) of from 5 to 25 nm, usually from 10 to 20 nm, such as about 19 nm (e.g. for the N10 node), 14 nm (e.g. for the N7 node) or 11 nm (e.g. for the N5 node). In embodiments, at least one trench may have a depth (e.g. a height; a dimension perpendicular to the substrate) of from 20 to 200 nm, usually from 50 to 100 nm. In embodiments, the trenches may be underfilled, or filled such that a top surface of the oxygen-containing dielectric material is coplanar with the top surface of the line structures, or overfilled (e.g. an overburden may be present); so long as the top surface of at least one of the line structures is at least partially exposed, the exposed part being composed of the oxygen-free dielectric material. In some embodiments, the trenches may be underfilled; for example, filling at least 50% of a trench depth, at least 70%, at least 90%, usually at least 95%, but less than 100% of said trench depth. In embodiments, providing the trenches being at least partially filled with the oxygen-containing dielectric material may comprise providing trenches fully filled (e.g. overfilled) with the oxygen-containing dielectric material and subsequently partially etching back the oxygen-containing dielectric material. The partial etching of the oxygen-containing dielectric material may be such that at least the exposed part of the top surface of the line structures is revealed and is typically such that also a small portion (e.g. depth of up to 5% or up to 10% of trench depth) of the oxygen-containing dielectric material in the trenches is removed. The trenches being partially underfilled (e.g. by up to 5% or up to 10% of the trench depth) can allow a well-protecting $TaSi_x$ capping layer to be formed over the exposed part (e.g. over the gate spacer).

The partial etch back removing a small portion of the oxygen-containing dielectric material in the trenches can allow minimization of the damage to the line structures (e.g. to the gate spacer and/or gate cap); as opposed to a large etch back, which would entail a long exposure of the line structures (e.g. of the gate spacer and/or gate cap) and thus risks to critically damage said line structures (e.g. opening up the gate spacer and/or gate cap and damaging the gate structure thereunder).

In embodiments, step a may comprise:
a1. providing the semiconductor structure wherein the top surface of the line structures is covered by an overlayer; and
a2. selectively removing at least a portion of the overlayer with respect to the oxygen-free dielectric material, thereby obtaining the exposed part of the top surface.

In embodiments, the overlayer may comprise the oxygen-containing dielectric material. In embodiments, the overlayer may have a thickness of from 5 to 20 nm, usually from 7 to 15 nm, such as 10 nm. The overlayer may function as a softmask layer for a hardmask provided thereon (cf. infra). In embodiments, step a2 of selectively removing at least the portion of the overlayer may comprise partially etching back the oxygen-containing dielectric material filling the trenches (cf. supra).

According to the present disclosure, $TaSi_x$ (e.g. $TaSi_2$) can be deposited selectively onto oxygen-free dielectric materials with respect to oxygen-containing dielectric materials, and furthermore that a particularly high etch selectivity of the oxygen-containing dielectric materials with respect to the $TaSi_x$ can be achieved. As such, it was conceived that structures having a surface comprising an oxygen-free dielectric material can be selectively capped with $TaSi_x$, which can in turn function as a kind of hardmask layer. In this respect, it is worth noting that the selective etching of the oxygen-containing dielectric material is typically a non-isotropic process, where the etching rate in the vertical direction (e.g. top-down) can be typically higher than the etching rate in the horizontal direction (e.g. sideways). As such, a $TaSi_x$, layer which reinforces the oxygen-free dielectric material in the top-down direction is typically sufficient to strengthen it against undesired removal. As such, the etch selectivity of the oxygen-containing dielectric material with respect to the oxygen-free material can be significantly improved, thus causing less damage to the oxygen-free dielectric material and thereby e.g. allowing less/thinner structures of oxygen-free dielectric material to be used. In embodiments, forming the layer of $TaSi_x$ may comprise a thermal atomic layer deposition (ALD). TaSi$_x$ tends to automatically selectively deposit on oxygen-free dielectric materials with respect to oxygen-containing dielectric materials.

In embodiments, selectively removing at least the portion of the oxygen-containing dielectric material with respect to the TaSi$_x$ in step c may comprise a plasma etching. In embodiments, the plasma etching may comprise a fluorine- and/or oxygen-based chemistry. In embodiments, the plasma etching may comprise the substeps of contacting an etchant (e.g. a C$_4$F$_6$/O$_2$/Ar gas mixture) to the oxygen-containing dielectric material and subsequently etching the oxygen-containing dielectric material. In embodiments, these substeps may be repeated in a cyclic process. Step c may be referred to as a fully self-aligned contact (fSAC) etch. In embodiments, the selectivity of step c may be such that at most 7 nm (i.e. measured in a top-down direction), usually at most 6 nm, of the oxygen-free dielectric material in the line structures (e.g. of the gate cap) is removed when an etch depth (i.e. measured in the same top-down direction) into the oxygen-containing dielectric material is at least 70 nm, usually at least 80 nm.

In embodiments, step c may be performed through a patterned hardmask. In embodiments, the patterned hardmask may be provided over a softmask layer (e.g. the overlayer, cf. supra). In embodiments, patterning the hardmask may be based on a photolithographic patterning and may comprise the use of a photoresist layer. In embodiments, an auxiliary stack (e.g. advanced patterning film (APF)/SiOC or spin-on-carbon (SoC)/spin-on-glass (SoG)) may be disposed between the hardmask and the photoresist layer.

In some embodiments, providing the patterned hardmask may comprise providing a patterned layer of an oxygen-free dielectric material over the semiconductor structure prior to step b and depositing a layer of TaSi$_x$ onto said patterned layer during step b. In some embodiments, the oxygen-free dielectric material for the hardmask may be the same material as the oxygen-free dielectric material comprised in the line structures. Using the area-selective TaSi$_x$ deposition to turn a patterned layer of the oxygen-free dielectric material into a hardmask can be a simple way of providing a hardmask, while avoiding the use of metallic materials such as TiN. The use of metallic materials is typically shunned in the manufacture of semiconductor devices, as these metallic materials can easily form contaminations in these devices.

In embodiments, the cavity may expose the semiconductor substrate (e.g. the source and/or drain region) and/or may expose at least one of the sidewalls of at least one of the line structures. In some embodiments, the cavity may expose both the semiconductor substrate and at least one of the sidewalls of at least one of the line structures. In embodiments, the cavity may be for forming a contact to a source/drain region. In embodiments, the method may comprise a further step d, after step c, of filling the cavity with a fill material. In embodiments, the fill material may comprise a conductive material (e.g. a fill metal, such as selected from W, Co, and Ru) and optionally a contact barrier (e.g. selected from Ti and TiN). In embodiments, the contact barrier may be a work function adjustment metal. In embodiments, filling the cavity with the fill material may comprise providing the contact barrier in the cavity prior to filling the cavity with the conductive material. In embodiments, the fill material may form a source/drain contact. In embodiments, the source/drain contact may be a wrap-around contact. In embodiments, the source/drain contact may be electrically coupled to the source/drain region. In embodiments, the source/drain contact may make an electrical contact with the source/drain region, and usually a direct mechanical contact.

In embodiments, the cavity may be overfilled in step d, thereby forming an overburden (i.e. a portion of the fill material extending above the cavity), and the method may comprise a further step e, after step d, of planarization of the overburden. In some embodiments, the layer of TaSi$_x$ may be removed during the planarization in step e. In this case, the planarization is can be performed such that the entire layer of TaSi$_x$ (e.g. both on top of the at least one line structure and on a side thereof) is removed. This typically involves also removing a portion of the line structure (e.g. a portion of the gate plug and/or gate spacer).

In a second aspect, the present disclosure relates to an intermediate structure for forming a cavity in a semiconductor structure, comprising:
 i. a semiconductor substrate;
 ii. a set of line structures on the semiconductor substrate, each line structure comprising a top surface, the line structures being separated by trenches therebetween, wherein the top surface of at least one of the line structures is composed of an oxygen-free dielectric material;
 iii. an oxygen-containing dielectric material filling at least partially the trenches in-between the line structures; and
 iv. a layer of TaSi$_x$ covering the oxygen-free dielectric material selectively with respect to the oxygen-containing dielectric material.

In embodiments, any feature of the second aspect may independently be as correspondingly described for any embodiment of the first aspect.

The disclosure will now be described by a detailed description of several embodiments of the disclosure. It is clear that other embodiments of the disclosure can be configured according to the knowledge of the person skilled in the art without departing from the true technical teaching of the disclosure, the disclosure being limited only by the terms of the appended claims.

EXAMPLE

Forming Source/Drain Contacts in FinFET Formation

We now refer to FIG. 1. A semiconductor structure is provided, comprising a semiconductor substrate (100), the semiconductor substrate (100) comprises a semiconductor active area (200) in the form of Si semiconductor fin. The semiconductor active area (200) comprises a channel region (210) defined between the epitaxially grown source/drain regions (220/230). The semiconductor active areas (200) can be isolated from each other by a SiO$_2$ shallow trench isolation layer (240; STI). The semiconductor structure further comprises a set of line structures (300) on the semiconductor substrate (100), a line structure (300) comprising a gate structure (310) capped with a Si$_x$N$_y$ oxygen-free dielectric gate plug (320) and Si$_x$N$_y$ oxygen-free dielectric spacers (330) lining the sidewalls of the gate structure (310) and gate plug (320). Optionally, the line structure (300) may further comprise a SiN etch stop liner (not shown) covering (e.g. lining) the oxygen-free dielectric spacers (330). A gate structure (310) comprises a high-k HfO$_2$ gate dielectric (311), a work function adjustment metal (311) and a W gate contact (312). The work function adjustment metal may for example be selected from TiN, TiN/TaN/TiN and TiN/TiAl/TaN/TiN. The longitudinal direction (longest dimension parallel to the substrate) of the gate structures (310) may be typically oriented perpendicularly to the longitudinal direction of the semiconductor fins (210). A SiO$_2$ oxygen-containing dielectric material (410) can fill up the trenches (400) in-between the line structures (300), e.g. over the source/drain regions (220/230).

Figure 2:
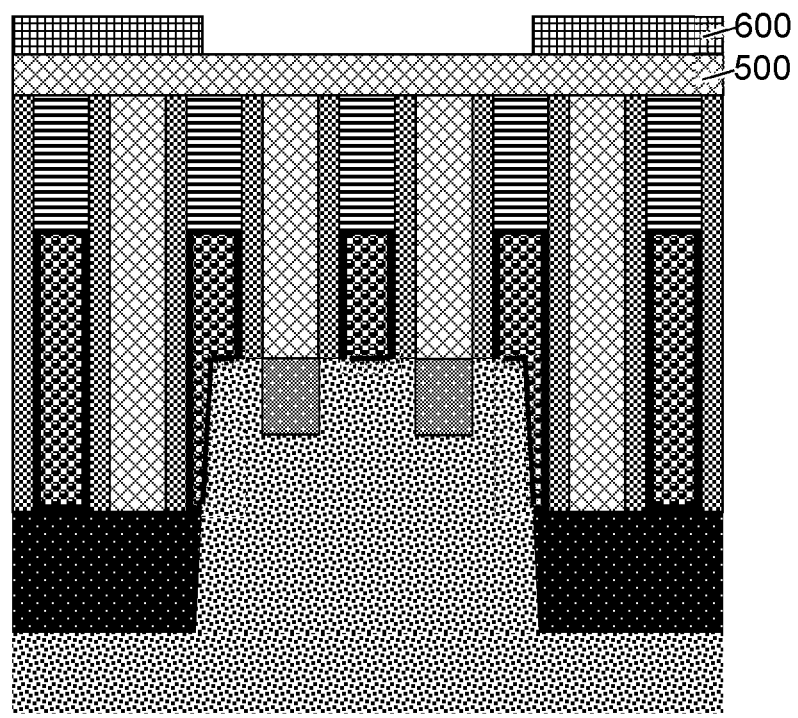

We now refer to FIG. 2. A 10 nm SiO$_2$ dielectric overlayer (500) can be deposited over the semiconductor structure and a patterned Si$_x$N$_y$ oxygen-free dielectric hardmask (600) can be provided thereon. For patterning the hardmask (600), an overlaying SiOC/advance patterning film (APF) stack or spin-on-glass (SoG)/spin-on-carbon (SoC) stack, in combination with a photoresist layer, can, for instance, be used (not shown).

Figure 3:
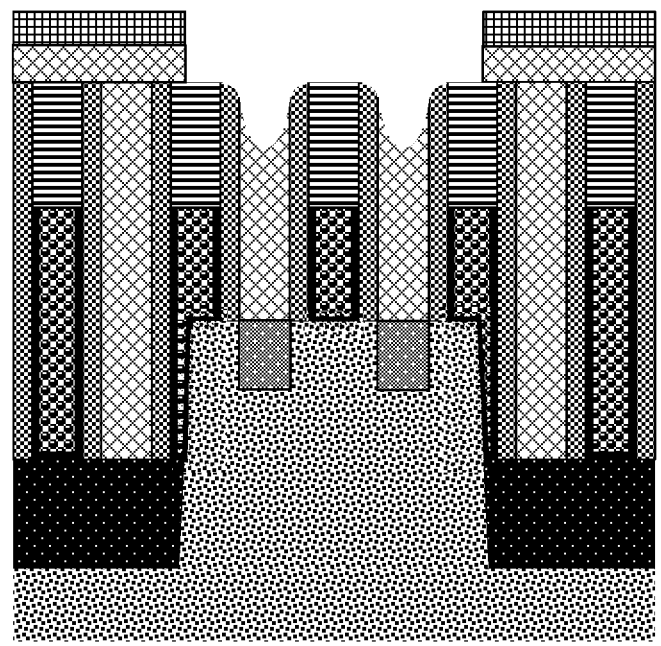

We now refer to FIG. 3. The pattern may be partially etched down by removing the oxygen-containing dielectric material, i.e. a portion of the overlayer (500) and/or filled trench (410) selectively with respect to the oxygen-free dielectric material, i.e. the gate plug (320), spacers (330) and/or hardmask (600), to such an extent as to expose the top surface of the gate plug (320) and spacers (330). This may, for example, be achieved by a plasma etch using a cyclic process of deposition and etch steps based on a C$_4$F$_6$/O$_2$/Ar gas mixture. A pressure of 15 mT, 100 w RF 2 MHz and 100 w RF 27 MHz power supplies and a chuck temperature of 110° C. may be used. Subsequently, a wet cleaning step may be performed to remove any remaining residue after the plasma etch.

Figure 4:
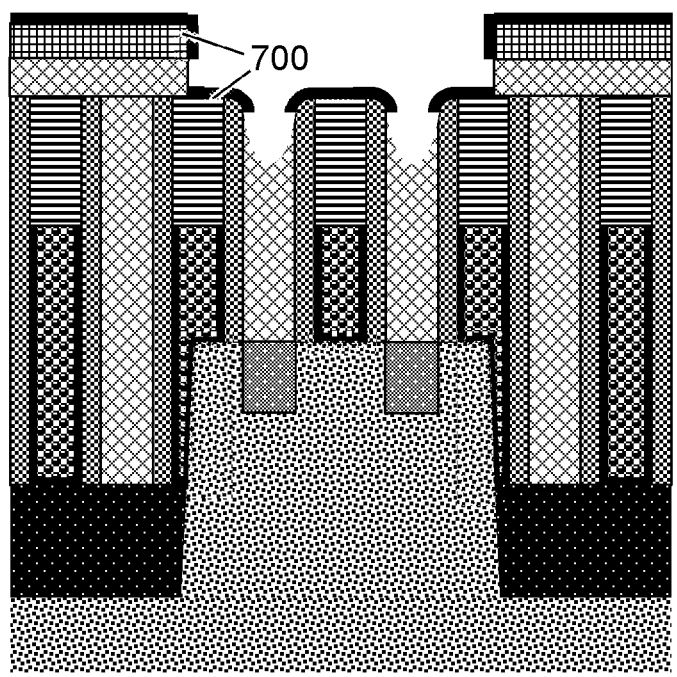

We now refer to FIG. 4. A layer of TaSi$_x$ (700) can be deposited selectively onto the oxygen-free dielectric material (320,330,600) with respect to the oxygen-containing dielectric material (410), thereby forming a mask (700) covering at least the top surface of the gate plug (320), spacers (330) and/or hardmask (600).

Figure 5:
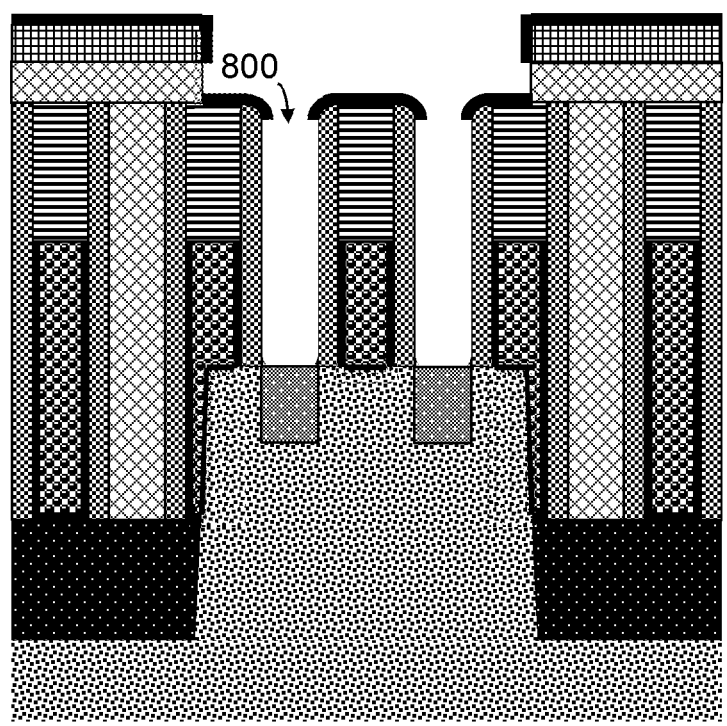

We now refer to FIG. 5. The oxygen-containing dielectric material (410) can be further removed from within the trenches (400), selectively with respect to the TaSi$_x$ (700) and oxygen-free dielectric material (320,330,600). The etch may be such that it has an anisotropic nature and a particularly high selectively with respect to the TaSi$_x$ material (700), such that the TaSi$_x$ material (700) protects the oxygen-free dielectric material (320,330,600) from being etched downwards. In this way, the oxygen-containing dielectric material (410) can be thoroughly removed without overetching into the oxygen-free dielectric material (320,330). To achieve this, the same plasma etch as described for FIG. 3 can be used, based on the C$_4$F$_6$/O$_2$/Ar gas mixture.

Figure 6:
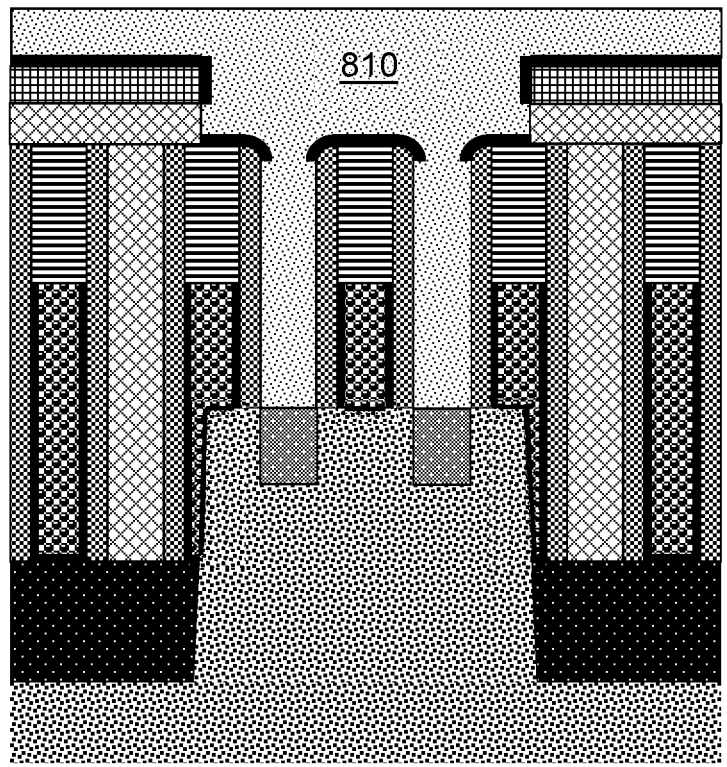

We now refer to FIG. 6. The trenches (400) can be lined with a Ti and/or TiN barrier layer (not shown) using ALD and overfilled with a W contact metal (810) using CVD or ALD.

Figure 7:
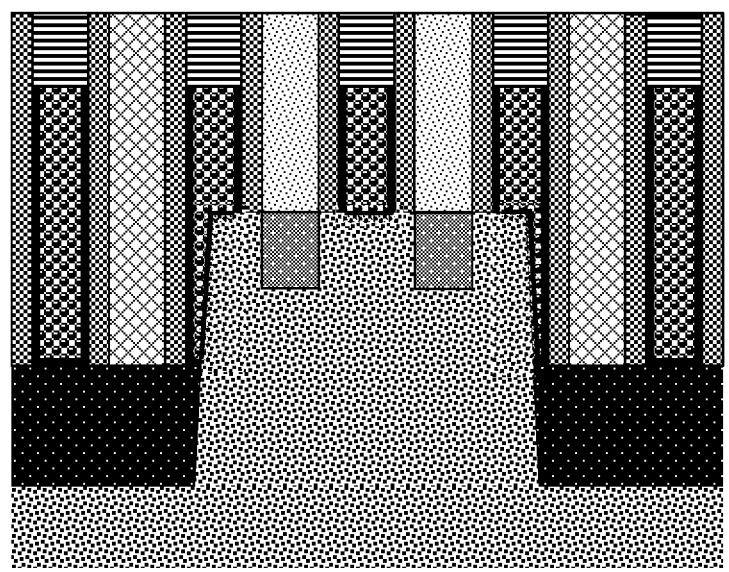

We now refer to FIG. 7. The contact metal (810) overburden can be removed by a chemical-mechanical planarization (CMP), thereby simultaneously also removing the TaSi$_x$ material (700).

In the example presented above, the hardmask (600) used comprises an oxygen-free dielectric material which is further reinforced by the TaSi$_x$ material (700) by the selective deposition of the latter. However, it will be clear that a hardmask could likewise be made of another material with a sufficient etch resistance to the subsequent etch techniques; the reinforcement by the TaSi$_x$ material (700) is, therefore, an optional feature.

It is to be understood that although some embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. A method for forming a cavity in a semiconductor structure, the method comprising:
   a) providing the semiconductor structure comprising:
      i. a semiconductor substrate;
      ii. a set of line structures on the semiconductor substrate, each line structure having a top surface and sidewalls, the line structures being separated by trenches therebetween; and
      iii. an oxygen-containing dielectric material at least partially filling the trenches in-between the line structures,
      wherein the top surface of at least one of the line structures is at least partially exposed, and
      wherein the exposed part of the top surface is composed of an oxygen-free dielectric material;
   b) forming a layer of TaSi$_x$ selectively onto the oxygen-free dielectric material with respect to the oxygen-containing dielectric material,
   c) forming the cavity by selectively removing at least a portion of the oxygen-containing dielectric material with respect to the TaSi$_x$ layer.

2. The method according to claim 1, wherein the cavity exposes the semiconductor substrate and/or exposes at least one of the sidewalls of at least one of the line structures.

3. The method according to claim 1, wherein the oxygen-containing dielectric material is SiO$_2$.

4. The method according to claim 1, wherein the oxygen-free dielectric material is Si$_x$N$_y$.

5. The method according to claim 1, wherein the semiconductor substrate comprises at least one semiconductor active area, the semiconductor active area comprising a channel region, a source region and a drain region.

6. The method according to claim 5, wherein at least one of the line structures comprises:
   a gate structure over the channel region, the gate structure having a top surface and sidewalls;
   a gate spacer lining at least one of the sidewalls of the gate structure; and
   a gate cap covering the top surface of the gate structure.

7. The method according to claim 6, wherein the gate spacer and/or the gate cap comprise the oxygen-free dielectric material.

8. The method according to claim 5, wherein the cavity forms a contact to the source region or to the drain region.

9. The method according to claim 1, wherein step a comprises:
   a1) providing the semiconductor structure wherein the top surface of the line structures is covered by an overlayer; and
   a2) selectively removing at least a portion of the overlayer with respect to the oxygen-free dielectric material, thereby obtaining the exposed part of the top surface.

10. The method according to claim 9, wherein the overlayer comprises the oxygen-containing dielectric material.

11. The method according to claim 1, wherein step c is performed through a patterned hardmask and wherein providing the patterned hardmask comprises providing a patterned layer of the oxygen-free dielectric material over the semiconductor structure prior to step b and depositing the layer of TaSi$_x$ onto said patterned layer during step b.

12. The method according to claim 1 comprising a further step d, after step c, of filling the cavity with a fill material.

13. The method according to claim 12, wherein the cavity is overfilled in step d, thereby forming an overburden, and comprising a further step e, after step d, of planarizing the overburden.

14. The method according to claim 13, wherein the layer of $TaSi_x$ is removed during the planarization in step e.

15. An intermediate structure for forming a cavity in a semiconductor structure, comprising:
   i) a semiconductor substrate;
   ii) a set of line structures on the semiconductor substrate, each line structure comprising a top surface, the line structures being separated by trenches therebetween, wherein the top surface of at least one of the line structures is composed of an oxygen-free dielectric material;
   iii) an oxygen-containing dielectric material filling at least partially the trenches in-between the line structures; and
   iv) a layer of $TaSi_x$ covering the oxygen-free dielectric material area-selectively with respect to the oxygen-containing dielectric material.

16. The intermediate structure according to claim 15, wherein the oxygen-containing dielectric material is $SiO_2$.

17. The intermediate structure according to claim 15, wherein the oxygen-free dielectric material is $Si_xN_y$.

18. The intermediate structure according to claim 15, wherein the semiconductor substrate comprises at least one semiconductor active area, the semiconductor active area comprising a channel region, a source region and a drain region.

19. The intermediate structure according to claim 18, wherein at least one of the line structures comprises:
   a gate structure over the channel region, the gate structure having a top surface and sidewalls;
   a gate spacer lining at least one of the sidewalls of the gate structure; and
   a gate cap covering the top surface of the gate structure.

20. The intermediate structure according to claim 19, wherein the gate spacer and/or the gate cap comprise the oxygen-free dielectric material.

* * * * *